(12) United States Patent
Auberton-Herve

(10) Patent No.: US 6,429,104 B1
(45) Date of Patent: Aug. 6, 2002

(54) METHOD FOR FORMING CAVITIES IN A SEMICONDUCTOR SUBSTRATE BY IMPLANTING ATOMS

(75) Inventor: Andre-Jacques Auberton-Herve, Saint-Egreve (FR)

(73) Assignee: S.O.I. Tec Silicon on Insulator Technologies, Bernin (FR)

(*) Notice: Subject to any disclaimer, the term of this patent is extended or adjusted under 35 U.S.C. 154(b) by 0 days.

(21) Appl. No.: 09/600,162

(22) PCT Filed: Feb. 1, 1999

(86) PCT No.: PCT/FR99/00197
§ 371 (c)(1), (2), (4) Date: Sep. 18, 2000

(87) PCT Pub. No.: WO99/39378
PCT Pub. Date: Aug. 5, 1999

(30) Foreign Application Priority Data

Feb. 2, 1998 (FR) .............................................. 98 01172

(51) Int. Cl.⁷ ............................................. H01L 21/425
(52) U.S. Cl. ....................... 438/527; 438/528; 438/462; 438/977
(58) Field of Search ................................. 438/514, 526, 438/513, 527, 528, 460–465, 977

(56) References Cited

U.S. PATENT DOCUMENTS

| | | | |
|---|---|---|---|
| 5,374,564 A | | 12/1994 | Bruel |
| 5,670,391 A | * | 9/1997 | Lim et al. ................... 438/527 |
| 5,714,395 A | * | 2/1998 | Bruel ......................... 438/458 |
| 5,759,904 A | * | 6/1998 | Dearnaley ................... 438/528 |
| 5,899,732 A | * | 5/1999 | Garner et al. ............... 438/473 |
| 5,920,764 A | * | 7/1999 | Hanson et al. ................ 438/4 |
| 6,103,597 A | * | 8/2000 | Aspar et al. ................ 438/458 |

FOREIGN PATENT DOCUMENTS

| | | |
|---|---|---|
| EP | 0 703 609 | 3/1996 |
| EP | 0 801 419 | 10/1997 |
| GB | 2 211 991 | 7/1989 |
| JP | 60182090 | 9/1985 |
| JP | 61087296 | 2/1986 |

\* cited by examiner

*Primary Examiner*—Savitri Mulpuri
(74) *Attorney, Agent, or Firm*—Jacobson Holman, PLLC

(57) ABSTRACT

The invention concerns a method for treating substrates, in particular semiconductors, by implanting atoms so as to produce a substrate of cavities at a controlled depth, characterized in that it comprises steps which consists in: implanting atoms in the substrate at a first depth, to obtain a first concentration of atoms at said first depth; implanting atoms in the substrate at a second depth, different from the first, to obtain at said second depth, a second concentration of atoms, lower than the first; carrying out on the substrate a treatment for causing at least part of the atoms implanted in said second depth to migrate towards the first depth so as to create the cavities at the first depth preferably.

19 Claims, 4 Drawing Sheets

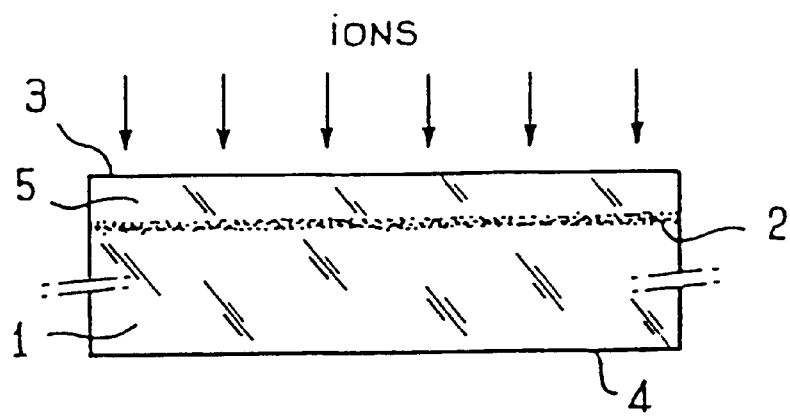
FIG_1a
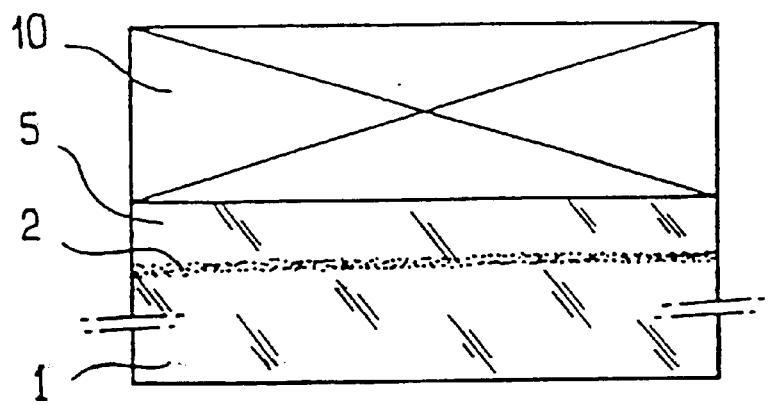
FIG_1b
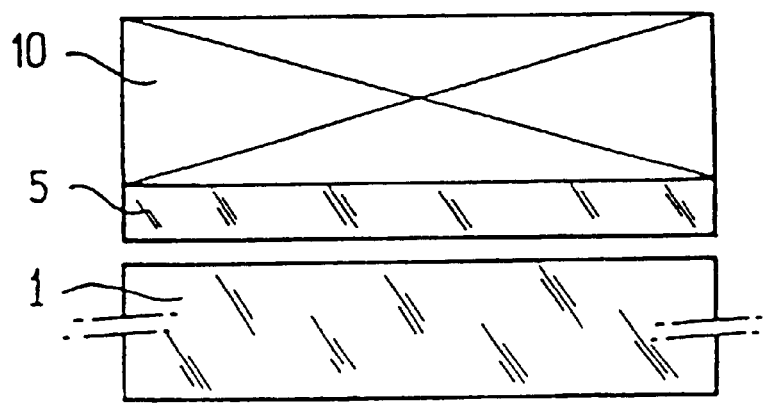
FIG_1c

FIG_2
PRIOR ART
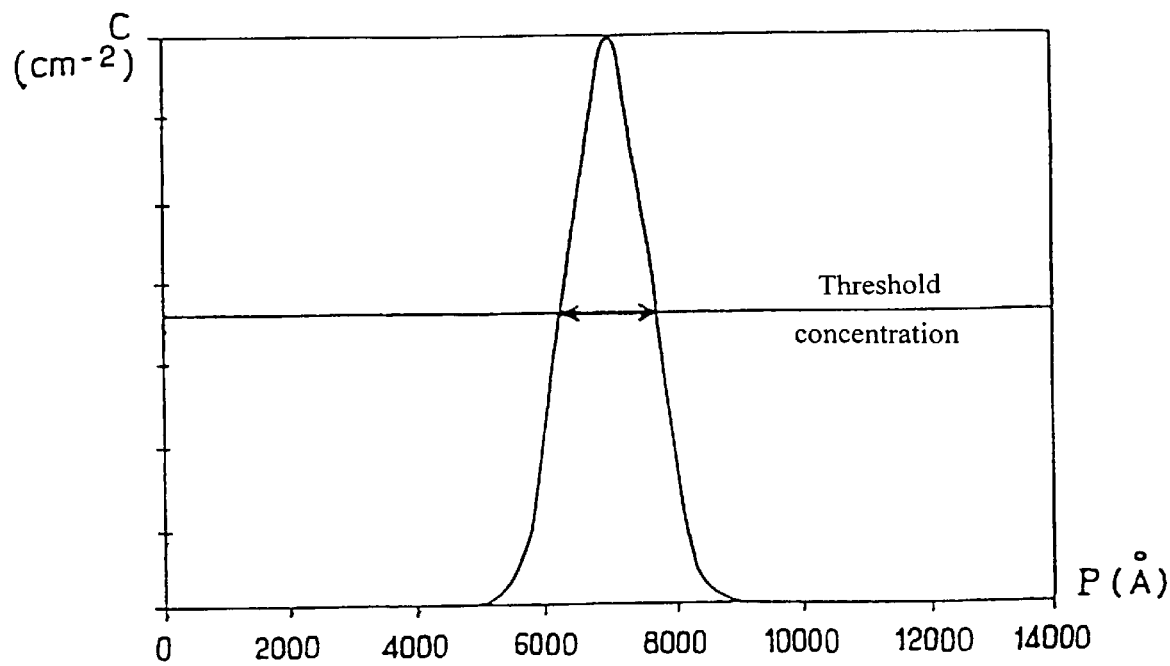
FIG_3
PRIOR ART
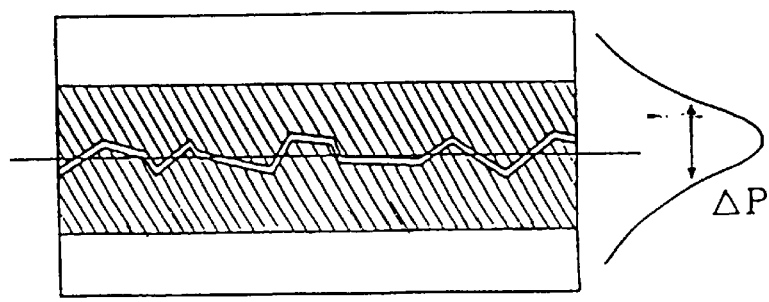

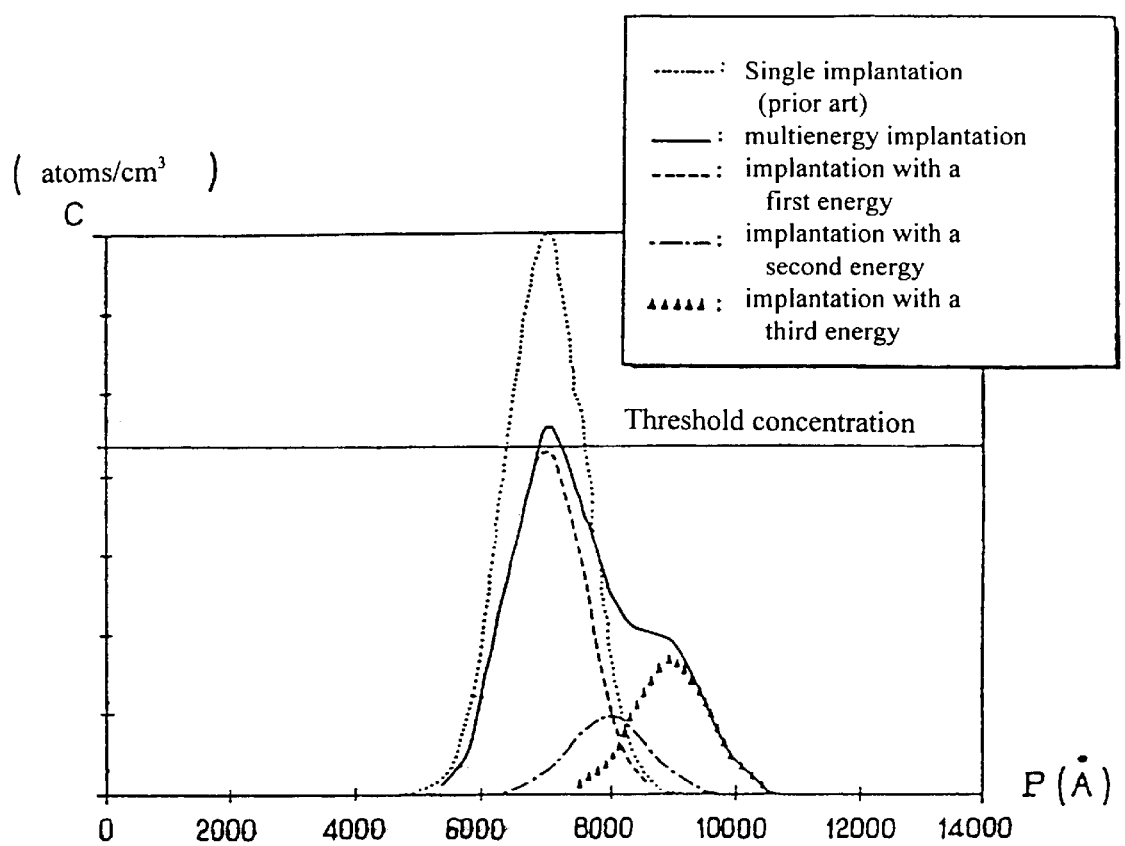
FIG_4
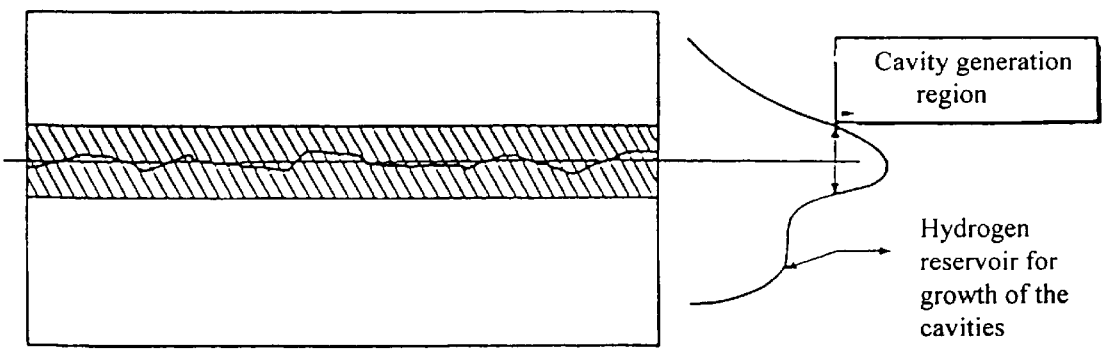
FIG_5

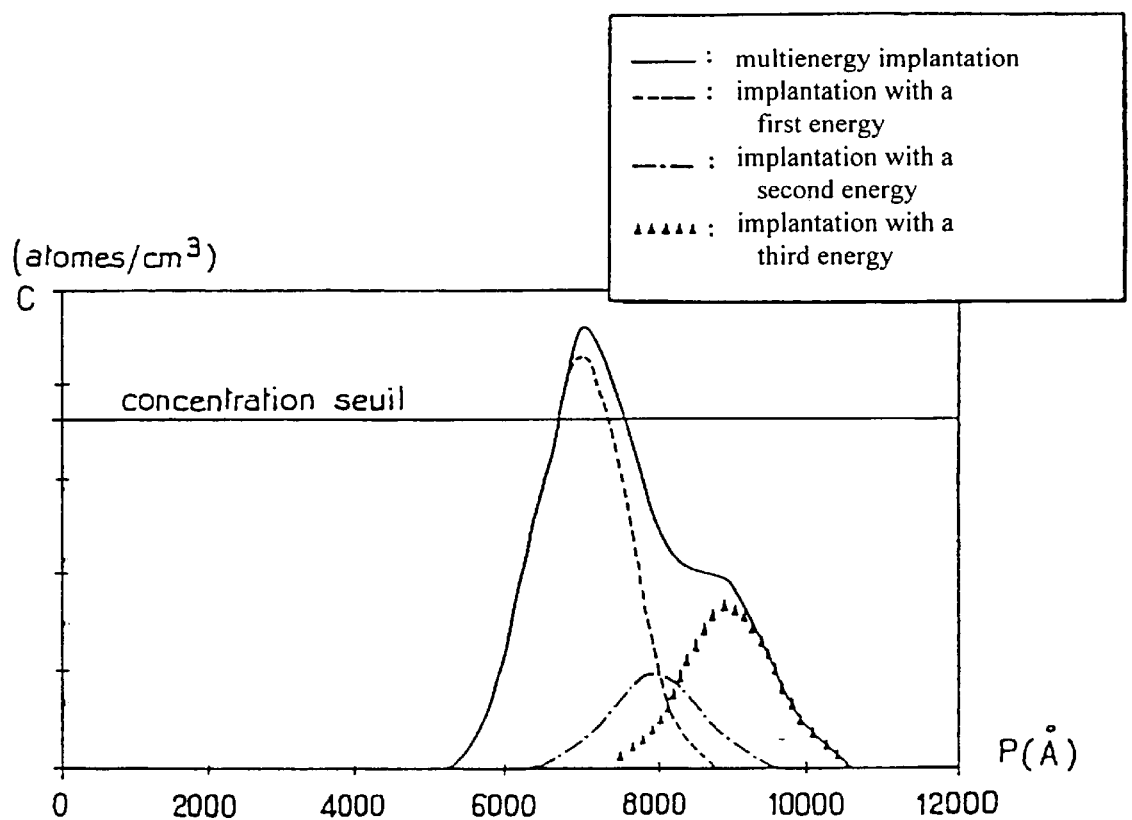
FIG_6

METHOD FOR FORMING CAVITIES IN A SEMICONDUCTOR SUBSTRATE BY IMPLANTING ATOMS

FIELD OF THE INVENTION

The present invention relates to the field of substrates, especially for electronic or optical components. More specifically, it relates to a process for preparing substrates, especially semiconductor substrates, which will be used for producing these components, or else to a process contributing to the production of these components themselves on a substrate.

Document U.S. Pat. No. 5,374,564 by M. Bruel already discloses a process for fabricating thin films of semiconductor materials which comprises the exposure of a wafer of semiconductor material

- to a step of bombarding one face of the substrate with ions so as to implant these ions in sufficient concentration to create a layer of microcavities,
- to a step of bringing this face of the substrate into intimate contact with a stiffener and
- to a heat treatment step in order to cleave the substrate at the layer of microcavities.

This process is, for example, used for the production of a thin silicon-on-insulator film, this thin film consisting of part of the substrate that has remained on the stiffener after cleavage.

With this type of process, the region where the implantation takes place is disturbed, thereby affecting the homogeneity of the thin film and its roughness at the surfaces located on either side of the cleavage surface. It is therefore necessary thereafter to carry out treatments to remove the defects, roughnesses, etc. These treatments consist, for example, in polishing the surfaces and/or healing the crystal structure by annealing. However, the greater the depthwise extent of the disturbed regions, the longer these treatments and the more affected the thickness homogeneity of the thin film and of the substrate remaining after cleavage.

Moreover, it is known that it is possible to use the micropores in the porous silicon to produce electroluminescent or photoluminescent components. However, these micropores obtained by electrochemical means extend over a great depth and are large in size, which may limit the quality of the luminescent phenomena that it is desired to exploit. It would therefore be advantageous for there to be semiconductor substrates having cavities the dimensions of which are better controlled and which extend over a better-localized depth so as to produce light-emitting components exhibiting better behavior.

SUMMARY OF THE INVENTION

One objective of the present invention is to propose a process allowing better control of the location, the formation and the growth of cavities.

This objective is achieved according to the invention by virtue of a process for treating substrates, especially semiconductor substrates, by atom implantation, for the purpose of creating cavities at a controlled depth in a substrate, characterized in that it comprises the steps consisting in:

- implanting atoms into the substrate at a first depth, in order to obtain a first atom concentration at this first depth;
- implanting atoms into the substrate at a second depth, different from the first, in order to obtain, at this second depth, a second atom concentration less than the first;
- carrying out, on the substrate, a treatment capable of making at least some of the atoms implanted at the second depth migrate toward the first depth so as to preferably generate the cavities at the first depth.

When atoms are made to penetrate a substrate from a surface of this substrate, for example by implantation, they become distributed within the substrate. The concentration of these atoms in the substrate has a depth-dependent distribution profile which forms a peak with a maximum at a certain depth. For a given concentration, this peak has a width which is greater the greater the number of atoms that have penetrated the substrate. The presence of these atoms in the substrate disturbs the latter and the extent of the disturbed region is greater, for a given concentration, the wider the peak. However, certain special effects, such as embrittlement of the substrate sufficient to be able to cleave it or the formation of microcavities in order to obtain a luminescent effect, etc., require a high concentration of implanted atoms in the region where it is desired to obtain the sought effect. It is in this type of case that the process according to the invention is particularly beneficial since it makes it possible to limit the depthwise extent of the disturbed region while still achieving the concentration necessary for obtaining the desired effects.

The process according to the invention therefore consists of a step of implanting atoms into the substrate in order to obtain a first atom concentration forming a first peak with a first width and a first maximum located at a first depth. By limiting the number of atoms implanted at this step, it is possible, for a given concentration, to reduce the width of the concentration profile. This results in a reduction in the depthwise extent of the region most disturbed by the implanted atoms.

During another step of the process according to the invention, atoms are implanted into the substrate at a second depth, different from the first, in order to obtain, at this second depth, a second atom concentration less than the first. Thus, a reservoir of implanted atoms, of structural perturbations such as defects or vacancies generated by the implanted atoms, chemical species linked to implanted atoms, etc. is formed, it then being possible for these to migrate or be transferred to the vicinity of the first depth. The number of atoms implanted into this reservoir is adapted so that the sum of the atoms implanted at the first depth and implanted at the second depth is sufficient to produce cavities at the first depth after a treatment capable of making at least some of the atoms implanted at the second depth migrate toward the first. It is understood that this treatment may also transfer, from the second depth to the first depth, structural perturbations such as defects or vacancies generated by the implanted atoms, and chemical species linked to the implanted atoms (V—$H_4$). We will consequently use the generic expression "species linked to the implanted atoms" to mean all of these perturbations and of these chemical species linked to the implanted atoms.

With the process according to the invention, it is therefore possible to reduce the width of the peak produced at the first depth, by implanting fewer atoms into the substrate during the corresponding implantation step, but to obtain the number of atoms necessary to obtain the desired effect, in the vicinity of the first depth by the supply of the implanted atoms, and of the various species linked to the implanted atoms, which have migrated from the reservoir.

Further aspects, objects and advantages of the present invention will appear on reading the detailed description which follows.

BRIEF DESCRIPTION OF THE DRAWINGS

The invention will also be more clearly understood by referring to the drawings in which:

FIG. 1 shows schematically the steps of one nonlimiting example of how to implement the process according to the invention;

FIG. 2 shows a dispersion profile of the implanted-ion concentration C as a function of the depth P in the substrate, this profile corresponding to one method of implementing a process of the prior art;

FIG. 3 shows schematically the dispersion profile of the implanted-atom concentration C as a function of the depth P, in the substrate, by the implementation of a process of the prior art;

FIG. 4 shows, on the same diagram, the profile already shown in FIG. 2 and a dispersion profile of the implanted-atom concentration C as a function of the depth P, this profile corresponding to one implementation method according to the invention;

FIG. 5 shows schematically the dispersion profile of the implanted-atom concentration C as a function of the depth P, in the substrate, by the implantation of a process according to the present invention; and FIG. 6 shows, on the same diagram, another dispersion profile of the implanted-atom concentration C as a function of the depth P, this profile corresponding to a method of implementation according to the invention.

DETAILED DESCRIPTION OF THE INVENTION

According to one particular, but nonlimiting, method of implementing the process according to the invention, shown in FIG. 1, this method is used for the preparation of a thin film 5, especially of semiconductor material.

More specifically still, the method of implementing the process according to the invention, detailed below, relates to the production of microcavities in substrates 1 in order to obtain, for example, thin silicon-on-insulator films 5.

Hereafter, we will denote by "microcavities" defects or cavities in the substrate 1 which are created by one or more implanted atoms. The shape and the size of the microcavities may vary very considerably. These microcavities may be generally spherical in shape. These are then referred to as microbubbles. However, more generally the microcavities are lens-shaped or have the shape of a flat cylinder or have a more irregular shape. Their size ranges from the order of one nanometer to a few hundred nanometers. These microcavities may contain a free gas phase and/or atoms of the material forming the walls of the microcavities. These microcavities are generally called platelets, microblisters or bubbles.

Hereafter, we will denote by the term "atom" the atom both in its ionized form and in its neutral form, or even in a molecular form.

A substrate 1 of semiconductor material is subjected to an atom implantation step in order to create a layer in which will be formed microcavities 2 and a reservoir layer (FIG. 1a); optionally to a step of bringing a face 3 of the substrate 1 into intimate contact with a stiffener 10 (FIG. 1b); and a heat treatment or annealing step which allows the atoms, and various species linked to the implanted atoms, to diffuse from the reservoir layer to the microcavity layer in order to make the microcavities grow (FIG. 1c). This growth of the microcavities induces stresses and the coalescence of some of the latter. This results in cleavage of the substrate 1 at the microcavity layer 2.

As shown in FIG. 1, the substrate 1 of semiconductor material has, for example, the shape of a wafer having two parallel main faces 3, 4, the dimensions of which are very substantially greater than the distance which separates these two faces 3, 4, that is to say greater than the thickness of the wafer. This wafer has, for example, a diameter of 200 mm (8 inches) and a thickness of 725 $\mu$m. The semiconductor material is, for example, single-crystal silicon, the faces 3 and 4 of which are parallel to the (100) crystallographic planes.

The thin film 5 is obtained from the substrate 1. The thin film 5 consists of the material lying between one 3 of the two faces 3, 4 and the microcavity layer 2, at which the cleavage will be induced.

The step of implanting the atoms of the microcavity layer 2 and of the reservoir layer is preferably carried out by ion bombardment on the face 3 of the substrate 1 (FIG. 1a). This is carried out by means of an ion implanter, the purpose of which is to accelerate atoms with an energy tailored to the desired implantation depth. It is possible, for example, to immerse the substrate 1 in a plasma using an accelerating electric field in the vicinity of the material to be implanted. It is also conceivable, without departing from the scope of the invention, to carry out implantation by diffusion into the substrate 1 of the atomic species to be implanted. In this case, the distribution profile of the concentration as a function of the depth in the substrate 1 no longer is a Gaussian-type peak but adopts rather the shape of a Poisson distribution. The maximum point of this distribution will then be called the "implantation depth".

If an ion implanter is used, the choice of the voltage for accelerating the ions allows their implantation depth to be controlled. The accelerated ions penetrate the substrate 1 where they undergo impacts with the silicon atoms, as well as electron deceleration. They therefore interact with the silicon atoms and possibly create chemical bonds with them (for example, Si—H bonds when the implanted atom is hydrogen).

The two modes of interaction, that is to say the impacts of implanted atoms with the silicon atoms and electron deceleration, induce a distribution of the implanted-atom concentration as a function of the implantation depth. The distribution profile of the implanted-atom concentration as a function of the implantation depth has a maximum (FIGS. 2, 4 and 6). This profile is roughly of the Gaussian type, but it obeys more complex statistical laws. This profile has a width, for a given concentration, which is greater the higher the dose of atoms bombarding the surface of the face 3. This dose determines the concentration of atoms implanted in the substrate 1 at a given depth. For example, when the face 3 of a single-crystal silicon wafer, corresponding to a (100) crystallographic plane, is subjected to a bombardment of $H^+$ ions accelerated by a voltage of 150 kV, the implanted atoms are distributed with a concentration maximum which is located at approximately 1.3 $\mu$m from the face 3.

An implanted-atom threshold concentration exists above which microcavities, or precursors for the growth of these microcavities, are formed with a sufficient size and in sufficient number for the region where this threshold concentration is reached to be a preferred region for the growth and coalescence of the microcavities, when a treatment, preferably a heat treatment, is carried out which can make implanted atoms and various species linked to the implanted atoms migrate into the vicinity of this region.

These regions where this threshold concentration is reached or exceeded are also those where the greatest perturbations and the cleavage will take place. It is the depthwise extent of these regions which it is advantageous to minimize.

In the method of implementation of the prior art, the bombardment was continued, while keeping the same accelerating voltage, beyond the threshold concentration so as to obtain the implanted-atom concentration necessary for cleavage. In this way, a single peak was obtained in the distribution profile of the implanted-atom concentration as a function of the depth. The width of this single peak and its maximum were relatively large (FIG. 2). The disturbed region, of width ΔP, which resulted from this was consequently also of relatively large depthwise extent (FIG. 3). This also resulted in significant roughness at the surfaces on either side of the cleavage plane as well as homogeneity defects in the material over a substantial depth from the cleavage interface.

In the method of implementation according to the present invention, atoms are implanted with a first energy. A first concentration distribution peak as a function of the implantation depth is obtained. This peak has a maximum, at the first depth, which corresponds to a first maximum concentration. The bombardment at this first energy is preferably stopped before the threshold atom concentration has been reached. In other words, after stopping the bombardment at this first energy, the atoms in the region of the substrate 1 are still at a concentration, close to the maximum of the concentration peak, which is insufficient to generate microcavities of sufficient size and in sufficient number to obtain cleavage under desired conditions.

In the method of implementing the invention described here, a second implantation and preferably a third implantation are carried out, with a second energy and a third energy, respectively, these energies differing from each other and differing from the first energy. An example of a distribution profile of the implanted-atom concentration C as a function of the depth P in the substrate 1, starting from the surface 3, obtained for this method of implementing the invention with three implantation energies is shown in FIG. 4. In order to compare this with the prior art, FIG. 4 also shows the distribution profile of FIG. 2, obtained with an implantation with a single energy. Also plotted in this figure is a line parallel to the x-axis at the implanted-atom threshold concentration.

According to the invention, the atoms bombarded on the face 3 of the substrate 1 with the second and third energies are implanted with maximum concentrations of less than the maximum concentration of atoms implanted with the first energy. After implantation with the second and third energies, the maximum total atom concentration is greater than the threshold concentration.

By way of example, with $H^+$ ions, implanted into (100)-oriented silicon, with an energy of between 60 and 80 keV, the threshold concentration is exceeded in a region extending depthwise over a distance of less than 600 Å, whereas with the process of the prior art this distance was greater than 800 Å.

Advantageously, in order to shift the disturbed region toward that part of the substrate 1 which will be removed after cleavage, the second and third energies are greater than the first energy.

The most stable microcavities are those present in the region where the implanted atoms are at their highest concentration, that is to say the region where they have been implanted with the first energy. This region is called the cavity generation region. Defects, and microcavities located in the areas of the substrate 1 which are in the vicinity of the cavity generation region, migrate toward the microcavities in this region during the heat treatment. The region from which the implanted atoms, and the various species linked to the implanted atoms, migrate toward the cavity generation region is called a reservoir. Thus, by tailoring the number of atoms implanted with the second and third energies, so that they constitute a sufficiently large reservoir of atoms, the microcavities can grow until they coalesce and/or until the stresses induced by this growth can cause cleavage of the substrate 1 within the cavity generation region.

FIG. 5 shows schematically a cavity generation region and the reservoir opposite the distribution profile of the implanted-atom concentration.

In the example of how to implement the process according to the invention illustrated in FIG. 4, the number of atoms implanted at the first depth is greater than the number of atoms implanted at the second and third depths, and the number of atoms implanted at the second depth is less than the number of atoms implanted at the third depth. In this example, the total dose of atoms implanted with the first, second and third energies is equal to that used in the case of the implantation of the prior art with a single energy.

The process for preparing thin films according to the invention is optimized by calibrating the concentrations of atoms implanted with the various energies so that the maximum concentration of atoms implanted with one of the energies is, before heat treatment, as close as possible to the threshold concentration, while implanting, in total, enough atoms to be able to make the microcavities grow and coalesce and/or to generate the stresses needed for cleavage.

In general, it is desired to obtain a distribution profile of the concentration as a function of the depth, which has a peak with a shoulder on its side deepest into the substrate 1. The peak must be an intense peak and must be well defined in order to optimize the localization of the microcavity formation region. The shoulder must be well developed in order to constitute a sufficiently large reservoir of implanted atoms. This result may be achieved in many ways, by carrying out multiple implantation with two, three or four different energies, or else by implanting atoms with two, three, four or more depths.

In order for the implanted atoms not to diffuse rapidly away from the region located at the desired depth or even out of the semiconductor material itself, the temperature of the substrate 1 is controlled and preferably maintained between 20° C. and 450° C. during the implantation step. However, after the implantation step, in order to make the implanted atoms and the various species linked to the implanted atoms migrate toward the first depth, the heat treatment temperature is advantageously greater than 150° C. This heat treatment must allow, in addition to the migration of the implanted atoms, crystal rearrangement and coalescence of the microcavities, both these with appropriate kinetics.

Advantageously, the atoms implanted at the first and second depths lie in two mutually parallel planes and are at most spaced apart from each other by a distance which is substantially less than the distance separating the plane of the first depth from the surface 3 of the substrate 1 or the surface closest to the plane of the first depth. This is because, during the heat treatment, there is migration of the implanted atoms and of the various species linked to the implanted atoms; it is then necessary for the implanted atoms, and the various species linked to the implanted atoms, at the second and third depths to be able to reach the cavity generation region without a significant amount of the atoms implanted at the first depth reaching the surface 3 of the substrate 1.

For many applications, it is desired to obtain a thin film 5 over a large area, or indeed over the entire area of the face 3 of the substrate 1. For this type of application, a stiffener 10 is sometimes needed. The function of the stiffener 10 is, inter alia, to limit the effect, on the thin film 5, of the stresses generated by the formation and the growth of the microcavities. The choice of the method of fabricating this stiffener 10 and of its nature is made depending on each intended application of the thin film. For example, if the intended application is that described above, i.e. the production of a thin silicon-on-insulator film 5, the stiffener 10 is advantageously a new silicon substrate covered with oxide. It is then the oxide which is brought into intimate contact with the substrate 1. This stiffener 10 may be deposited directly on the substrate 1, using deposition techniques such as evaporation, sputtering or chemical vapor deposition, whether or not enhanced by plasma or by photons, whenever the thickness is moderate, i.e. of the order of a few micrometers to a few tens of micrometers. The stiffener 10 may also be adhesively bonded to the substrate 1, either by a substance which adheres both to the stiffener 10 and to the substrate 1, or by heat and/or electrostatic treatment possibly combined with a suitable pressure in order to favor interatomic bonds between the stiffener 10 and the substrate 1.

The main improvement provided by the method of implementing the process according to the invention, described above, on the prior art is a reduction in the depthwise extent of the disturbed region and/or the roughness on the thin film 5.

According to an alternative method of implementing the process according to the invention, described above, the maximum concentration reached during the implantation with the first energy is greater than the threshold concentration (FIG. 6). In this case, a width of the region where the concentration is greater than the threshold concentration is obtained which is greater than with the method of implementation described above, but the fabrication process may be speeded up by the reduction in the migration times.

For some applications, it is not necessarily sought to reduce the width of the disturbed region. For example, in order to produce very thin films, it may be more a question of seeking to shift the center of gravity of the concentration peak toward that area of the substrate 1 which is located to the side of the cleavage plane which will comprise the thin film 5. For this purpose, an implantation with a first energy is carried out in order to implant atoms with a maximum concentration, possibly greater than the threshold concentration. This localizes the thin film 5 between the face 3 and the plane where these atoms are implanted. At least one other implantation is then carried out with a second energy, greater than the first energy, but so that the maximum concentration remains less than that corresponding to the first energy. In this way, the atoms implanted with the higher energy may constitute a reservoir of implanted atoms, and of various species linked to the implanted atoms, which are able to migrate toward the region where the implanted-atom concentration is greater. This reservoir is located on the other side of the thin film 5 with respect to this region. After cleavage, those areas of the substrate 1 which are disturbed by the formation of the reservoir do not form part of the thin film 5. Furthermore, because of the production of the reservoir, the number of atoms implanted with the first energy may be less than that which would be required for a single implantation. The peak corresponding to the implantation with the first energy may therefore be less intense and narrower, thereby better localizing the region where the concentration is greater than the threshold concentration, further away depthwise. By shifting the start of this region in this way, it is possible to reduce the thickness of the thin films 5 that can be produced.

The invention is also especially advantageous when it is desired to implant with a higher energy, for example when the thin film 5 is covered with a thick oxide layer. This is because the higher the energy the greater the dispersion and the wider the distribution peak of the concentration as a function of the depth and, consequently, the larger the disturbed region. The invention, by making it possible to limit the width of the disturbed region, makes it possible to limit the treatments intended to remove this region and makes it possible to obtain thin films 5 which are more homogeneous in terms of thickness.

In the foregoing, the terms "first", "second" and "third" are not used to specify any operating order. Thus, the implantations carried out with the second and third energies may be carried out before that carried out with the first energy.

In the example of implementing the process according to the invention described above and shown in FIG. 1, this comprises a heat treatment step allowing the atoms and the various species linked to the implanted atoms to diffuse from the reservoir layer toward the microcavity generation layer. This heat treatment step is carried out after bringing the substrate 1 into intimate contact with a stiffener 10. However, according to variants of the process according to the invention, this heat treatment step is started during one of the implantation steps or all of the implantation steps.

According to yet other variants, this heat treatment step is started after implantation and completed during an annealing operation after the substrate 1 has been brought into intimate contact with a stiffener 10.

According to yet other variants, when it is not necessary to use a stiffener 10, this heat treatment step is carried out entirely during the implantation steps, or is started during the implantation steps and completed subsequently, etc.

According to yet other variants, heat treatment steps are inserted between the various implantation steps.

In the example of implementing the process according to the invention described above, a single species of atoms—hydrogen—is used. For some applications, it is advantageous for the implanted atoms to be rare gas atoms. Advantageously too, several atomic species may be used for the same treatment of the substrate 1. The other atomic species that can be used are, for example, helium, argon, neon, krypton or xenon. However, it is possible to use any other atom capable of creating microcavities or an embrittlement region in the material which undergoes the treatment.

Each atomic species may be accelerated to a different energy or even several atomic species may be accelerated to the same energy.

In the example of how to implement the process according to the invention described above, cleavage is obtained due to the stresses imposed by the growth of the microcavities and the coalescence of the latter. These effects are induced by the migration, caused by the heat treatment, of the atoms implanted with the second and third energies, and of the various species linked to the atoms implanted with the second and third energies. This heat treatment may be combined with a mechanical stress capable of facilitating or inducing cleavage within the microcavities. This mechanical stress is, for example, generated by a shear force, a tensile force, etc., or by ultrasound. This variant of the method of implementing the process according to the invention is particularly useful when all that is required is to embrittle the substrate 1 within the cavity generation region without necessarily making these microcavities grow until they coalesce and undergo cleavage, for example by using the heat treatment only to make the implanted atoms and the various species linked to the implanted atoms migrate from the reservoir toward the cavity generation region.

In the example of how to implement the process according to the invention described above, the material of the substrate 1 is a semiconductor and more specifically single-crystal silicon, which may or may not be porous. However, the process according to the invention is applicable to substrates of any other material, whether a semiconductor or not (such as silica, for example) used in a single-crystal, polycrystalline or even amorphous state. Moreover, these various states may or may not be rendered porous.

Also advantageously, the process according to the invention may be implemented on a substrate 1 comprising, on its face 3, at least one element giving it a heterogeneous structure by the nature of the material of this element or by features that this element generates on this face 3. This heterogeneous structure consists, for example, of an electronic component or of a homogeneous or heterogeneous multilayer structure.

In the example of how to implement the process according to the invention described above, the material of the stiffener 10 is silicon covered with oxide. However, the process according to the invention is applicable to stiffeners 10 of any other material, whether a semiconductor or not (such as silica, for example), used in a single-crystal, polycrystalline or even amorphous state. However, these various states may or may not be rendered porous.

Advantageously too, the process according to the invention may be implemented with a stiffener 10 comprising, on its face for being brought into contact with the substrate 1, at least one element giving it a heterogeneous structure by the nature of the material of this element or by the features that this element generates on this face. This heterogeneous structure consists, for example, of an electronic component or of a homogeneous or heterogeneous multilayer structure.

In the example of how to implement the process according to the invention described above, and shown in FIG. 1, this comprises a step of bringing a face 3 of the substrate 1 into intimate contact with a stiffener 10. However, a stiffener 10 is not always needed. This is the case especially when the microcavity generation region is deep enough for the part lying between this region and the face 3 to be sufficiently thick for it to fulfill the stiffener function by itself. This film 5, obtained in this way, is then called a "self-supporting structure".

The process according to the invention is also applicable to substrates 1 which are insulators, superconductors, etc. In general, it will be used advantageously with materials for fabricating electronic, optical or optoelectronic components.

What is claimed is:

1. A process for treating substrates, especially semiconductor substrates, by atom implantation for the purpose of creating cavities in a substrate at a controlled depth, comprising the steps of:
   implanting atoms into the substrate at a first depth, in order to obtain a first atom concentration at said first depth on an entire area of the substrate;
   implanting atoms into the substrate at a second depth different from the first depth, in order to obtain, at said second depth, a second atom concentration less than the first atom concentration; and
   carrying out, on the substrate, a treatment capable of making at least some of the atoms implanted at the second depth migrate toward the first depth, so as to generate cavities at the first depth.

2. The process according to claim 1, wherein the treatment capable of making at least some of the implanted atoms migrate is also capable of transferring, toward the first depth, structural perturbations and chemical species created at the second depth by, and linked with, the atoms implanted at said second depth.

3. The process according to claim 2, wherein the treatment capable of making at least some of the atoms implanted at the second depth migrate and of transferring, toward the first depth, structural perturbations and chemical species linked to the atoms implanted at said second depth, is a heat treatment.

4. The process according to claim 1, wherein the cavities formed at the first depth constitute an embrittlement region within which cleavage of the substrate may take place.

5. The process according to claim 1, wherein said process is applied to treatment of substrates intended for production of electroluminescent or photoluminescent components.

6. The process according to claim 1, wherein the implanted atoms are hydrogen or rare gas atoms.

7. The process according to claim 1, wherein several atomic species are used for the same treatment of the substrate.

8. The process according to claim 1, wherein at least one of said implanting steps is carried out by ion bombardment.

9. The process according to claim 1, wherein at least one of the steps of implanting atoms into the substrate is carried out by immersing the substrate in a plasma.

10. The process according to claim 1, wherein the atoms are implanted at the first and second depths, respectively, in two mutually parallel planes, and at most separated from each other by a distance which is substantially less than a distance separating the plane lying at the first depth from a surface of the substrate closest to the first depth.

11. The process according to claim 1, wherein a multiple implantation is carried out in order to implant atoms at several different depths so as to obtain a concentration distribution profile having a peak with a shoulder on its deepest side.

12. The process according to claim 1, wherein the implantation of the atoms is carried out at three different depths.

13. The process according to claim 12, wherein the number of atoms implanted at the first depth is greater than the number of atoms implanted at the second and third depths, and the number of atoms implanted at the second depth is less than the number of atoms implanted at the third depth.

14. A process for treating a semiconductor substrate by atom implantation to create cavities in the substrate at a controlled depth, comprising the steps of:
   implanting atoms into the substrate at a first depth to obtain a first atom concentration at said first depth, said first atom concentration forming a continuous layer extending over an entire area of the substrate;
   implanting atoms into the substrate at a second depth, different from the first depth, to obtain at said second depth a second atom concentration less than the first atom concentration; and
   carrying out, on the substrate, a treatment to make at least some of the atoms implanted at the second depth migrate to the first depth, so as to generate cavities at said first depth.

15. The process according to claim 14, wherein the treatment which makes at least some of the implanted atoms migrate also transfers, toward the first depth, structural perturbations and chemical species created at the second depth by, and linked with, the atoms implanted at said second depth.

16. The process according to claim 15, wherein the treatment which makes at least some of the atoms implanted at the second depth migrate and which transfers, toward the first depth, structural perturbations and chemical species linked to the atoms implanted at said second depth, is a heat treatment.

17. The process according to claim 14, wherein the cavities formed at the first depth constitute an embrittlement region within which cleavage of the substrate may take place.

18. The process according to claim 14, wherein the atoms are implanted at the first and second depths, respectively, in two mutually parallel planes, and at most separated from each other by a distance which is less than a distance separating the plane lying at the first depth from a surface of the substrate closest to the first depth.

19. The process according to claim 14, further comprising the step of:
- implanting atoms into the substrate at a third depth, different from the first depth;
- wherein a number of atoms implanted at the first depth is greater than a number of atoms implanted at the second and third depths, and the number of atoms implanted at the second depth is less than the number of atoms implanted at the third depth.

* * * * *